United States Patent
Jang et al.

(10) Patent No.: US 12,294,774 B2
(45) Date of Patent: May 6, 2025

(54) DISPLAY DEVICE INCLUDING A DISPLAY PANEL MOVABLE OVER AN OPTICAL SENSOR WHILE PHOTOGRAPHING PLURAL IMAGES FOR SYNTHETIZATION

(71) Applicant: LG Display Co., Ltd., Seoul (KR)

(72) Inventors: JongWook Jang, Paju-si (KR); SeungTaek Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 278 days.

(21) Appl. No.: 17/975,555

(22) Filed: Oct. 27, 2022

(65) Prior Publication Data

US 2023/0217090 A1 Jul. 6, 2023

(30) Foreign Application Priority Data

Dec. 30, 2021 (KR) .................. 10-2021-0192777

(51) Int. Cl.
*H04N 23/53* (2023.01)
*G06T 5/50* (2006.01)
(Continued)

(52) U.S. Cl.
CPC ............... *H04N 23/53* (2023.01); *G06T 5/50* (2013.01); *G09G 3/007* (2013.01); *G09G 3/3208* (2013.01); *H04M 1/0264* (2013.01); *H04N 23/54* (2023.01); *H10K 59/121* (2023.02); *H10K 59/60* (2023.02); *H10K 59/65* (2023.02); *G09G 2310/0286* (2013.01); *G09G 2380/02* (2013.01);
(Continued)

(58) Field of Classification Search
CPC ...... H04N 23/53; H04N 23/531; H04N 23/54; H04N 23/55; H04N 23/57; H04M 1/0264; H04M 1/0235; H04M 1/0237; H04M 1/0239; H04M 1/0266; G09G 3/007; G09G 3/3208; G09G 2310/0286; G09G 2380/02; G06T 5/50; H10K 59/121; H10K 59/60; H10K 59/65; G06F 1/1605; G06F 1/1607; G06F 1/1624; G06F 1/1686; F16M 11/043; F16M 11/046; F16M 11/048; F16M 11/06; F16M 11/10
See application file for complete search history.

(56) References Cited

U.S. PATENT DOCUMENTS 11,070,743 B2 7/2021 Sun et al.
11,330,194 B2 5/2022 Sun et al.
(Continued)

FOREIGN PATENT DOCUMENTS

JP 4074986 B2 * 4/2008 ............. G02B 30/25
KR 10-2021-0092012 A 7/2021
(Continued)

*Primary Examiner* — Timothy J Henn
*Assistant Examiner* — Akshay Trehan
(74) *Attorney, Agent, or Firm* — Fenwick & West LLP

(57) ABSTRACT

A display device is provided, which may improve camera image quality. The display device comprises a display panel including a first display area and a second display area in which a plurality of transmissive areas are disposed, a roller portion coupled to the display panel at one side of the display panel, moving the display panel, an optical sensor disposed to overlap the second display area of the display panel, and a driving controller controlling the roller portion to rotate forward or backward based on an operation of the optical sensor.

15 Claims, 12 Drawing Sheets

(51) Int. Cl.
*G09G 3/00* (2006.01)
*G09G 3/3208* (2016.01)
*H04M 1/02* (2006.01)
*H04N 23/54* (2023.01)
*H04N 23/57* (2023.01)
*H10K 59/121* (2023.01)
*H10K 59/60* (2023.01)
*H10K 59/65* (2023.01)

(52) U.S. Cl.
CPC ........ *H04M 1/0235* (2013.01); *H04M 1/0266* (2013.01); *H04N 23/57* (2023.01)

(56) References Cited

U.S. PATENT DOCUMENTS

| | | | |
|---|---|---|---|
| 2019/0373166 A1* | 12/2019 | Jia | G09G 3/2003 |
| 2020/0128191 A1 | 4/2020 | Sun et al. | |
| 2020/0195764 A1* | 6/2020 | Xu | H04N 23/45 |
| 2021/0168302 A1 | 6/2021 | Sun et al. | |
| 2021/0203854 A1* | 7/2021 | Choi | H04N 23/57 |
| 2021/0265431 A1 | 8/2021 | Yun et al. | |
| 2022/0201222 A1 | 6/2022 | Sun et al. | |

FOREIGN PATENT DOCUMENTS

| | | |
|---|---|---|
| KR | 10-2021-0107215 A | 9/2021 |
| KR | 10-2021-0109059 A | 9/2021 |

\* cited by examiner

DISPLAY DEVICE INCLUDING A DISPLAY PANEL MOVABLE OVER AN OPTICAL SENSOR WHILE PHOTOGRAPHING PLURAL IMAGES FOR SYNTHETIZATION

CROSS-REFERENCE TO RELATED APPLICATIONS

This patent application claims priority under 35 U.S.C. § 119(a) from Republic of Korea Patent Application No. 10-2021-0192777 filed on Dec. 30, 2021, which is incorporated herein by reference in its entirety.

BACKGROUND

Field of the Invention

The present disclosure relates to a display device provided with an optical sensor.

Description of the Related Art

A display device includes various display elements, such as a liquid crystal display element or an organic light emitting element, in a display area. The display device has been devised to apply various applications by embedding a camera therein to link the display area to the camera.

In the display device, the camera may be disposed below a display panel. In this way, the display device embedded with a camera may not display an image on an area overlapped with the camera, and in this case, the image displayed on the display device may be disconnected and recognized by a user. Meanwhile, when a plurality of pixels are disposed to display the image on the area overlapped with the camera, light transmittance may be reduced due to the arrangement of the plurality of pixels over the camera, whereby quality of a camera image may be deteriorated.

SUMMARY

The present disclosure has been made in view of the above problems and it is an object of the present disclosure to provide a display device that may display an image even on an area overlapped with an optical sensor.

It is another object of the present disclosure to provide a display device that may improve image quality of an optical sensor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display device comprising a display panel including a first display area and a second display area in which a plurality of transmissive areas are disposed, a roller portion coupled to the display panel at one side of the display panel, moving the display panel, an optical sensor disposed to overlap the second display area of the display panel, and a driving controller controlling the roller portion to rotate forward or backward based on an operation of the optical sensor.

In accordance with another aspect of the present disclosure, the above and other objects can be accomplished by the provision of a display device comprising an optical sensor acquiring a first frame image and a second frame image continuously in accordance with an operation signal, and a display panel including a first display area and a second display area overlapped with the optical sensor, in which a plurality of transmissive areas are disposed. The display panel has different positions overlapped with the optical sensor at a photographing timing of the first frame image and a photographing timing of the second frame image.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
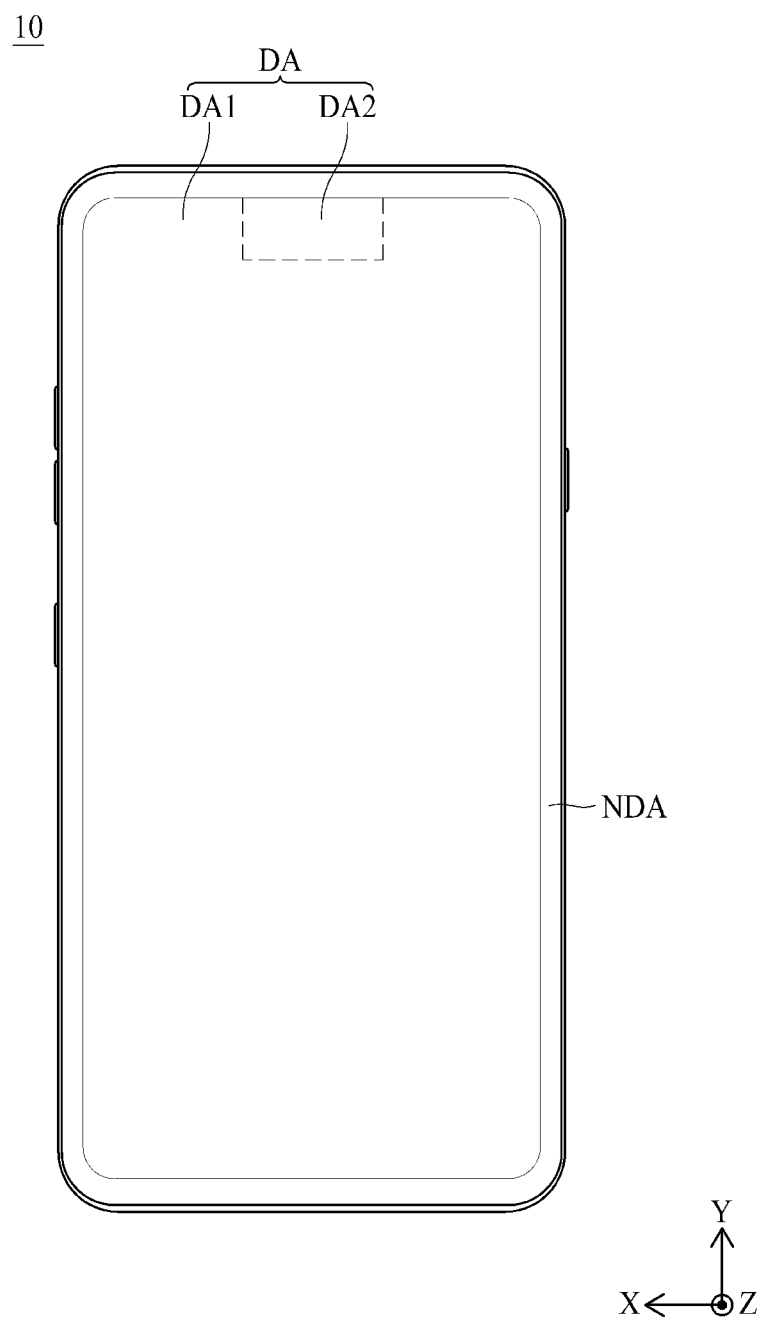
FIG. 1 is a schematic plan view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
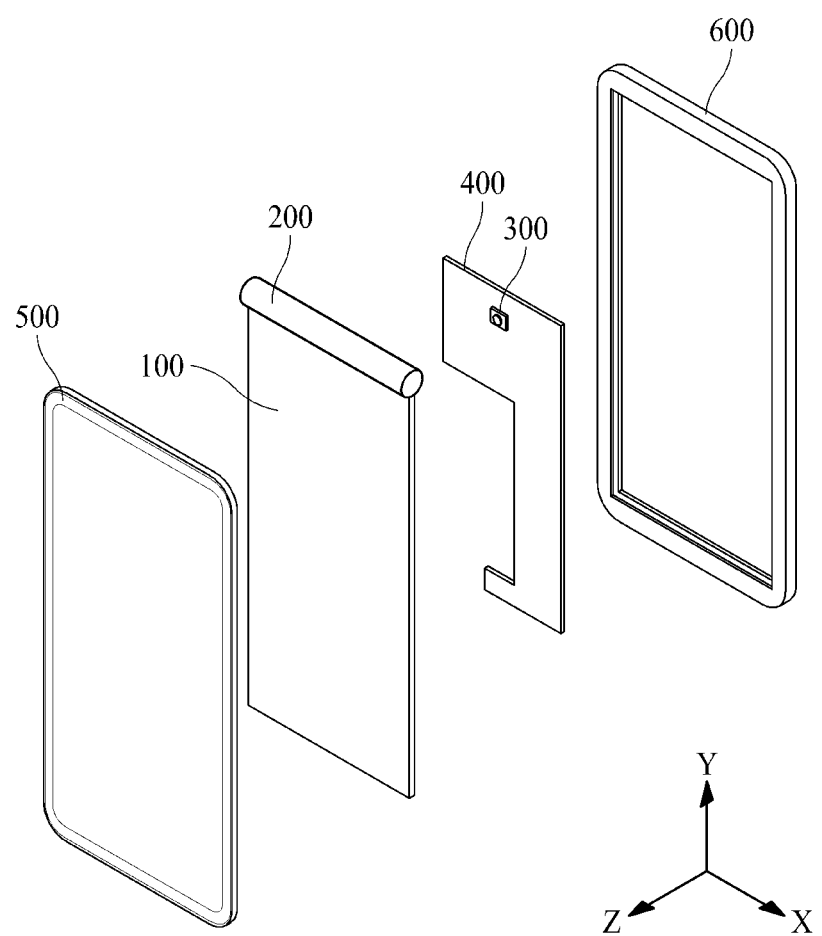
FIG. 2 is a schematic exploded view illustrating a display device according to one embodiment of the present disclosure.

FIG. 1 is a schematic plan view illustrating a display device according to one embodiment of the present disclosure, and FIG. 2 is a schematic exploded view illustrating a display device according to one embodiment of the present disclosure.

Referring to FIGS. 1 and 2, a display device 10 according to one embodiment of the present disclosure may include a display panel 100, a roller portion 200, an optical sensor 300, a circuit board 400, a cover window 500 and a frame 600.

The display panel 100 may be categorized into a display area DA in which pixels are formed to display an image and a non-display area NDA in which an image is not displayed.

The non-display area NDA may be disposed to surround the display area DA. The non-display area NDA may include a driver for supplying various signals to a plurality of signal lines in the display area DA and a link portion for connecting the driver with the plurality of signal lines. The driver may include a gate driver for supplying a gate signal to a gate line and a data driver for supplying a data signal to a data line.

Although the display panel 100 is described as being implemented as an organic light emitting display device, it may be also implemented as a liquid crystal display device, a plasma display panel (PDP), a quantum dot light emitting display (QLED) device or an electrophoretic display device.

The roller portion 200 may be coupled to the display panel 100 at one side of the display panel 100. For example, the roller portion 200 may be disposed on an upper side of the display panel 100 as shown in FIG. 2. The roller portion 200 may include a roller that is rotatable, a roller module connected to the roller to forward or backward rotate the roller, and a coupling unit for coupling the roller to one side of the display panel 100. The roller portion 200 may move the display panel 100 in a predetermined direction while rotating the roller forward or backward. For example, when the roller rotates forward, the display panel 100 may move upward while winding. On the other hand, when the roller rotates backward, the display panel 100 may move downward while unwinding.

Figure 3:
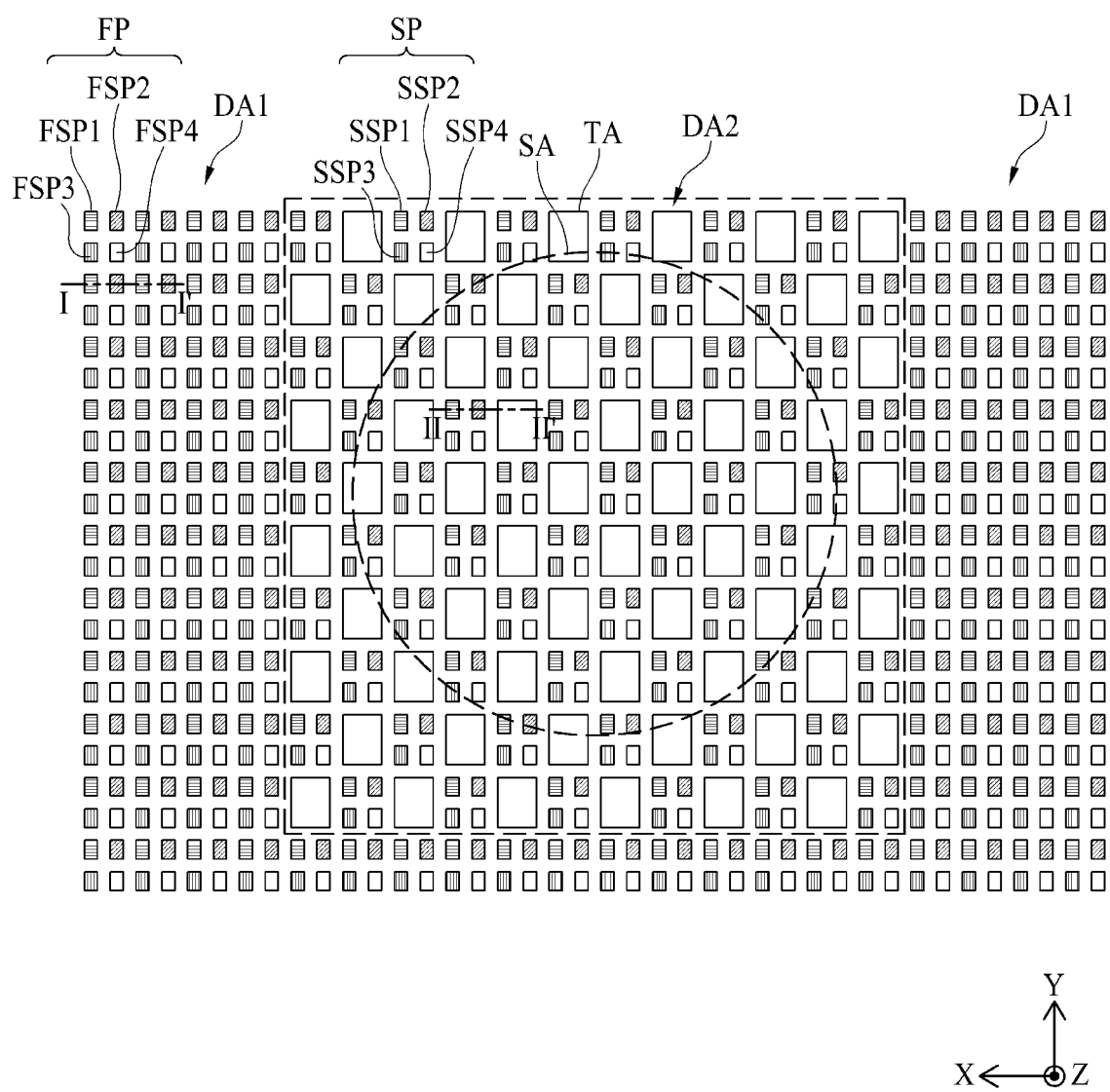
FIG. 3 is a schematic plan view illustrating subpixels disposed in a display panel according to one embodiment of the present disclosure.

The optical sensor 300 may be disposed over a rear surface of the display panel 100. The optical sensor 300 may be provided to overlap the display area DA of the display panel 100, particularly a second display area DA2 as shown in FIG. 3. The optical sensor 300 may mean all elements that measure external light input through the display panel 100 to use the measured external light. For example, the optical sensor 300 may be a camera, but is not limited thereto. The optical sensor 300 may be an infrared sensor, an illuminance sensor, a fingerprint sensor or the like.

The circuit board 400 may be disposed over the rear surface of the display panel 100. The circuit board 400 may be a printed circuit board (PCB) or a flexible printed circuit board (FPCB).

The cover window 500 may be disposed over a front surface of the display panel 100. The cover window 500 may protect the display panel 100 from external impact by covering the front surface of the display panel 100.

The cover window 500 may be made of a transparent plastic material, a glass material or a reinforced glass material. As an example, the cover window 500 may have any one of a stacked structure of sapphire glass and gorilla glass. As another example, the cover window 500 may include any one of polyethyleneterephthalate (PET), polycarbonate (PC), polyethersulfone (PES), polyethylenapthanate (PEN) and polynorbornene (PNB). The cover window 500 may be made of reinforced glass in consideration of scratch and transparency.

The frame 600 may accommodate the display panel 100 and support the cover window 500. The frame 600 may include an accommodating portion that may accommodate the roller portion 200, the optical sensor 300 and the circuit board 400. The frame 600 allows the display panel 100, the roller portion 200, the optical sensor 300 and the circuit board 400 to be fixed to the display device 10. The frame 600 may serve to protect the display panel 100, the roller portion 200, the optical sensor 300 and the circuit board 400 from impact. The frame 600 may be a middle frame or a housing, but is not limited thereto.

Hereinafter, subpixels disposed in a first display area DA1 and the second display area DA2 of the display panel 100 will be described in detail.

Figure 4:
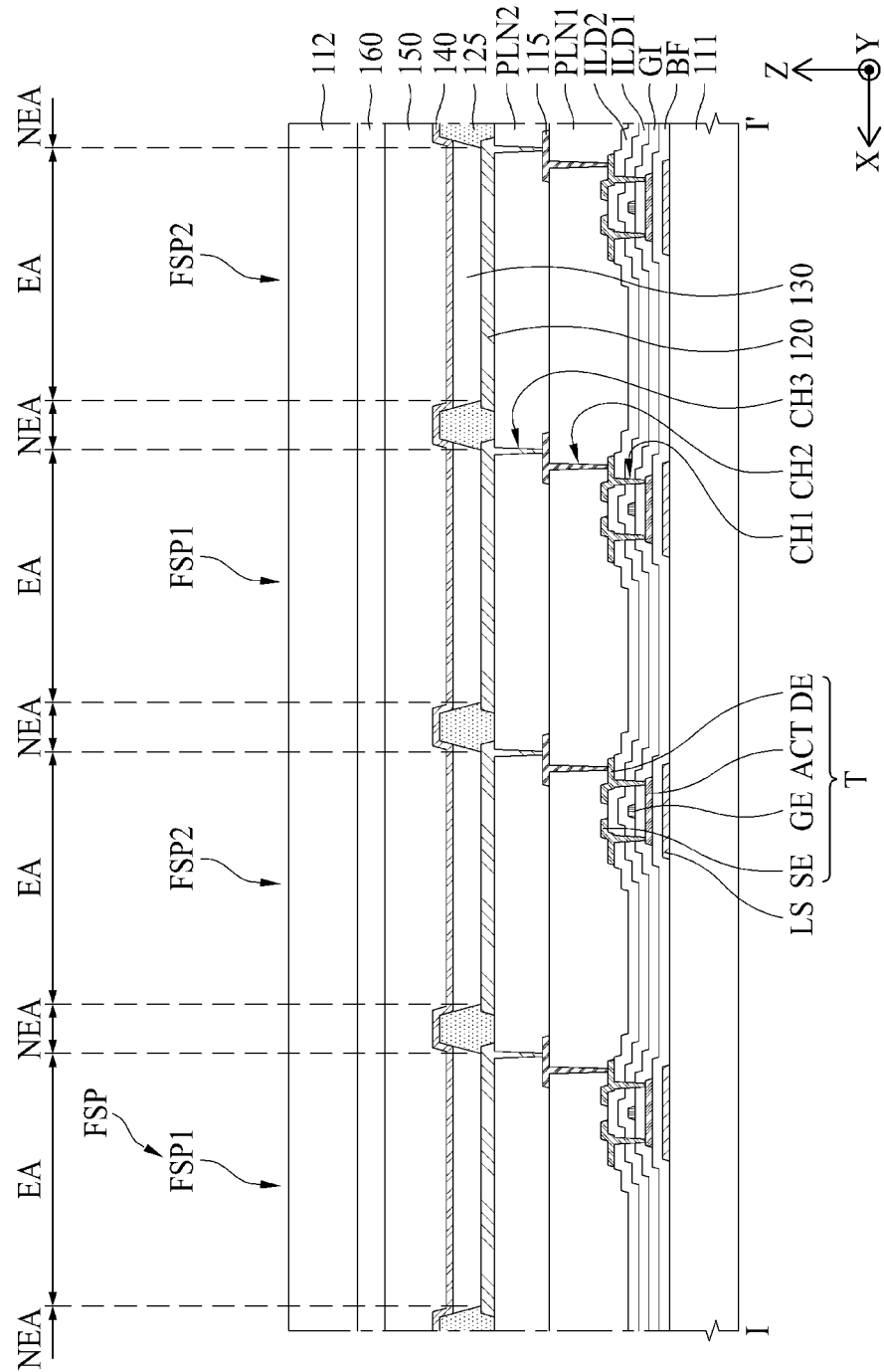
FIG. 4 is a cross-sectional view illustrating an example of I-I' of FIG. 3.
Figure 5:
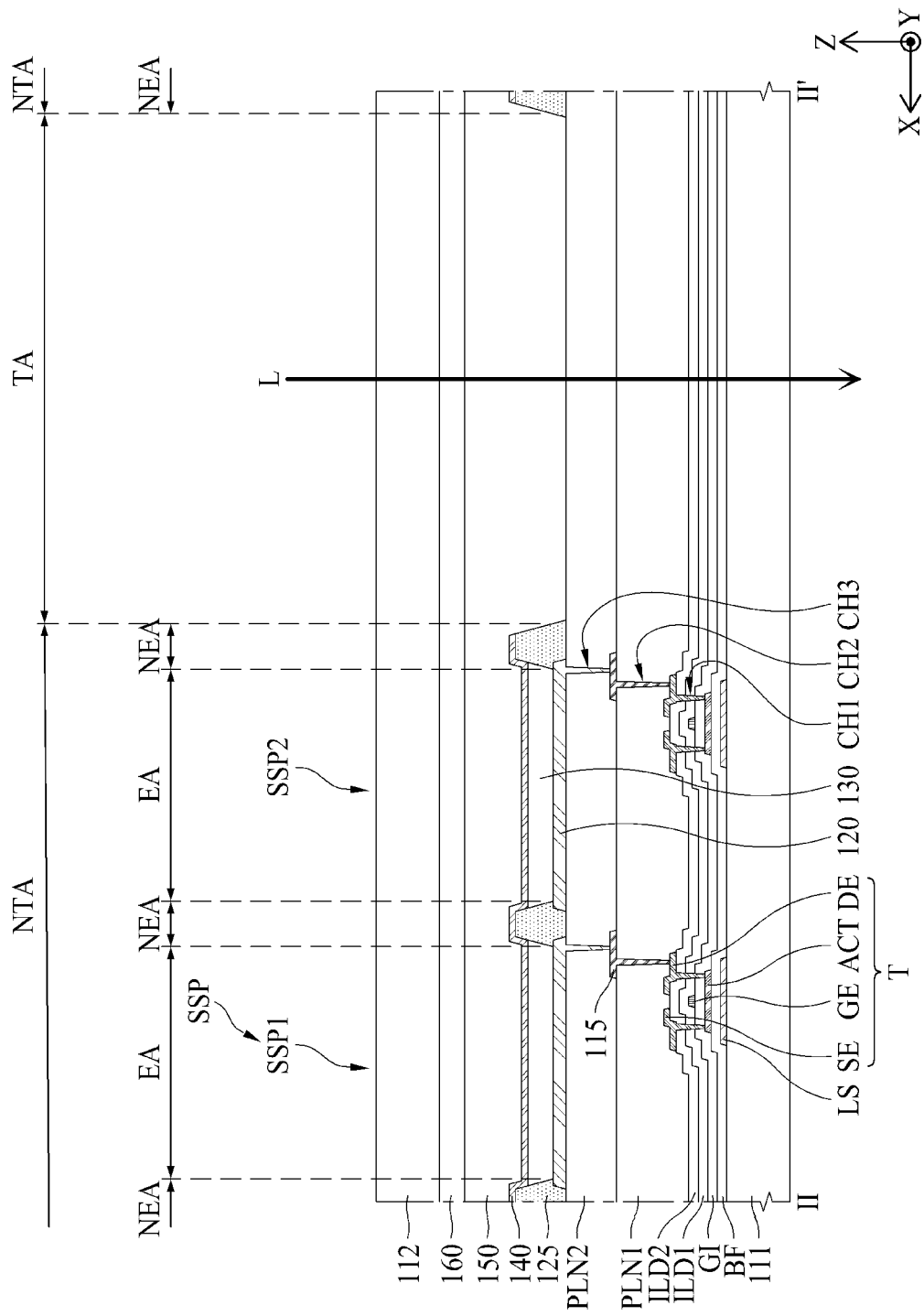
FIG. 5 is a cross-sectional view illustrating an example of II-II' of FIG. 3.

FIG. 3 is a schematic plan view illustrating subpixels disposed in a display panel according to one embodiment of the present disclosure, FIG. 4 is a cross-sectional view illustrating an example of I-I' of FIG. 3, and FIG. 5 is a cross-sectional view illustrating an example of II-II' of FIG. 3.

Referring to FIGS. 3 to 5, the display panel 100 includes a first display area DA1 and a second display area DA2. A plurality of first pixels FP may be disposed in the first display area DA1 The plurality of first pixels FP emit predetermined light to display an image. A light emission area EA may correspond to an area, which emits light, in the first pixel FP.

Each of the plurality of first pixels FP may include a plurality of first subpixels FSP. The plurality of first subpixels FSP may include a first color subpixel FSP1, a second color subpixel FSP2 and a third color subpixel FSP3. The first color subpixel FSP1 may emit red light, the second color subpixel FSP2 may emit green light and the third color subpixel FSP3 may emit blue light, but they are not limited thereto. Each of the first pixels FP may further include a fourth color subpixel FSP4 that emits white light. Various modifications may be made in the arrangement order of the first subpixels FSP without limitation to that shown in FIG. 3.

A circuit element, which includes a capacitor, a thin film transistor and the like, and a light emitting element may be provided in each of the first subpixel FSP1, the second subpixel FSP2 and the third subpixel FSP3. The thin film transistor may include a switching transistor, a sensing transistor, and a driving transistor T.

The switching transistor may be switched in accordance with a scan signal supplied to a scan line to supply a data voltage supplied from a data line to the driving transistor T.

The sensing transistor serves to sense a threshold voltage deviation of the driving transistor T, which causes deterioration of image quality.

The driving transistor T is switched in accordance with the data voltage supplied from the switching transistor to generate a data current from a power source supplied from a pixel power line, thereby supplying the data current to a first electrode 120 of the subpixels FSP1, FSP2, FSP3 and FSP4.

The driving transistor T includes an active layer ACT, a gate electrode GE, a source electrode SE and a drain electrode DE.

In detail, a light shielding layer LS may be provided over a first substrate 111. The light shielding layer LS may shield external light incident on the active layer ACT of the driving transistor T.

A buffer film BF may be provided over the light shielding layer LS. The buffer film BF may protect the transistors T from moisture permeated through the first substrate 111 vulnerable to moisture permeation. The active layer ACT may be provided over the buffer film BF. The active layer ACT may include a silicon-based semiconductor material or an oxide-based semiconductor material.

A gate insulating layer GI may be provided over the active layer ACT. A gate electrode GE may be provided over the gate insulating layer GI. A first interlayer dielectric layer ILD1 and a second interlayer dielectric layer ILD2 may be provided over the gate electrode GE.

A source electrode SE and a drain electrode DE may be provided over the second interlayer dielectric layer ILD2. One of the source electrode SE and the drain electrode DE may be connected to the active layer ACT through a first contact hole CH1 that passes through the gate insulating layer GI and the first and second interlayer dielectric layers ILD1 and ILD2.

A first planarization layer PLN1 may be provided over the source electrode SE and the drain electrode DE to planarize a step difference due to the driving transistor T. An auxiliary electrode 115 may be provided over the first planarization layer PLN1. The auxiliary electrode 115 may be connected to one of the source electrode SE and the drain electrode DE through a second contact hole CH2 that passes through the first planarization layer PLN1. A second planarization layer PLN2 may be provided over the auxiliary electrode 115.

Light emitting elements, which include a first electrode 120, an organic light emitting layer 130 and a second electrode 140, and a bank 125 are provided over the second planarization layer PLN2.

The first electrode 120 may be provided over the second planarization layer PLN2 for each of the subpixels FSP1, FSP2, FSP3 and FSP4. The first electrode 120 may be connected to the driving transistor T. In detail, the first electrode 120 may be connected to the auxiliary electrode 115 through a third contact hole CH3 that passes through the second planarization layer PLN2. Since the auxiliary electrode 115 is connected to the source electrode SE or the drain electrode DE of the driving transistor T through the second contact hole CH2, the first electrode 120 may be electrically connected to the driving transistor T.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode of the light emitting element.

The bank 125 may be provided over the second planarization layer PLN2. The bank 125 may be provided to at least partially cover an edge of the first electrode 120 and expose a portion of the first electrode 120. Therefore, the bank 125 may solve a problem in which light emitting efficiency is deteriorated due to concentration of a current on an end of the first electrode 120.

The bank 125 may define a light emission area EA of each of the subpixels FSP1, FSP2, FSP3 and FSP4. The light emission area EA of each of the subpixels FSP1, FSP2, FSP3 and FSP4 represents an area in which the first electrode 120, the organic light emitting layer 130 and the second electrode 140 are sequentially stacked so that holes from the first electrode 120 and electrons from the second electrode 140 are combined with each other in the organic light emitting layer 130 to emit light. In this case, the area in which the bank 125 is not provided and the first electrode 120 is exposed may become the light emission area EA, and the other area may become a non-light emission area NEA.

The organic light emitting layer 130 may be provided over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transporting layer and the electron transporting layer, respectively, and are combined with each other in the light emitting layer to emit light.

In one embodiment, the light emitting layer of the organic light emitting layer 130 may be provided for each of the first subpixels FSP1, FSP2 and FSP3. For example, a red light emitting layer for emitting red light may be provided in the first subpixel FSP1, a green light emitting layer for emitting green light may be provided in the second subpixel FSP2, and a blue light emitting layer for emitting blue light may be provided in the third subpixel FSP3.

In another embodiment, the organic light emitting layer 130 may be a common layer commonly provided in the subpixels FSP1, FSP2 and FSP3. In this case, the light emitting layer may be a white light emitting layer for emitting white light.

The second electrode 140 may be provided over the organic light emitting layer 130 and the bank 125. The second electrode 140 may be provided in the non-transmissive area NTA (not shown). The second electrode 140 may be a common layer that is commonly provided in the subpixels FSP1, FSP2 and FSP3 to apply the same voltage to the subpixels. The second electrode 140 may include a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 includes a semi-transmissive conductive material, light emitting efficiency may be increased by a micro cavity.

An encapsulation layer 150 may be provided over the light emitting elements. The encapsulation layer 150 may be provided over the second electrode 140 to cover the second electrode 140. The encapsulation layer 150 serves to prevent oxygen or moisture from being permeated into the organic light emitting layer 130 and the second electrode 140. To this end, the encapsulation layer 150 may include at least one inorganic layer and at least one organic layer.

Although not shown in FIGS. 4 and 5, a capping layer may be additionally provided between the second electrode 140 and the encapsulation layer 150.

The first substrate 111 and a second substrate 112, in which the encapsulation layer 150 is provided, may be bonded to each other by a separate adhesive layer 160. The adhesive layer 160 may be an optically clear resin layer (OCR) or an optically clear adhesive film (OCA).

Referring back to FIG. 3, the second display area DA2 is disposed to overlap an area SA in which the optical sensor 300 is disposed. The second display area DA2 may include a transmissive area TA and a non-transmissive area NTA. The transmissive area TA is an area through which most of the light incident from the outside passes, and the non-transmissive area NTA may be an area through which most of the incident light does not pass. External light may be incident on the optical sensor 300, which is positioned on the rear surface of the display panel 100, through the transmissive areas TA.

A plurality of second pixels SP may be provided in the second display area DA2. The second pixels SP are provided in the non-transmissive area NTA disposed between the transmissive areas TA to emit predetermined light, thereby displaying an image. The light emission area EA may correspond to an area, which emits light, in the second pixel SP.

Each of the plurality of second pixels SP may include a plurality of second subpixels SSP. The plurality of second subpixels SSP may include a first color subpixel SSP1, a second color subpixel SSP2 and a third color subpixel SSP3. The first color subpixel SSP1 may emit red light, the second color subpixel SSP2 may emit green light, and the third color subpixel SSP3 may emit blue light, but they are not limited thereto. Each of the second pixels SP may further include a fourth color subpixel SSP4 that emits white light.

Various modifications may be made in the arrangement order of the second subpixels SSP without limitation to that shown in FIG. 3.

A circuit element, which includes a capacitor, a thin film transistor and the like, and a light emitting element may be provided in each of the first subpixel SSP1, the second subpixel SSP2 and the third subpixel SSP3. The thin film transistor may include a switching transistor, a sensing transistor, and a driving transistor T.

Since the transistor T of the second subpixel SSP is substantially the same as the transistor T of the first subpixel FSP, its detailed description will be omitted. In addition, since the light emitting element of the second subpixel SSP substantially has the same elements as those of the first subpixel FSP, its detailed description will be omitted. Hereinafter, differences from the first subpixel FSP will be described in detail.

The light emitting element of each of the second subpixels SSP may be disposed between the plurality of transmissive areas TA. In detail, the first electrode 120 and the organic light emitting layer 130 of the light emitting element may be provided to be patterned for each of the second subpixels SSP1, SSP2, SSP3 and SSP4 between the plurality of transmissive areas TA. That is, the first electrode 120 and the organic light emitting layer 130 of the light emitting element may not be provided in the plurality of transmissive areas TA.

Meanwhile, the second electrode 140 of the light emitting element may be provided in the non-transmissive area NTA, and may not be provided in the plurality of transmissive areas TA, but is not limited thereto. When the second electrode 140 is made of a transparent metal material capable of transmitting light, the second electrode 140 may be also provided in the transmissive area TA.

In the display panel 100 according to one embodiment of the present disclosure, since the first electrode 120, the organic light emitting layer 130 and the second electrode 140 of the light emitting element as well as the transistor T are not provided in the plurality of transmissive areas TA as described above, light loss may be avoided by these elements, whereby light transmittance of the transmissive area TA may be improved.

As described above, the display panel 100 according to one embodiment of the present disclosure may include a plurality of transmissive areas TA in an area SA overlapped with the optical sensor 300. Therefore, the optical sensor 300 positioned over the rear surface of the display panel 100 may measure external light L passing through the transmissive area TA.

Meanwhile, the display panel 100 according to one embodiment of the present disclosure may also include a plurality of second pixels SP as well as a plurality of transmissive areas TA in the area SA overlapped with the optical sensor 300. Therefore, in the display panel 100 according to one embodiment of the present disclosure, an image may be displayed in the area SA overlapped with the optical sensor 300, so that the area SA overlapped with the optical sensor 300 may not be recognized by a user.

However, since the area in which the plurality of second pixels SP are provided corresponds to the non-transmissive area NTA having low light transmittance, the external light may not be transmitted in the area in which the plurality of second pixels SP are provided. Therefore, the optical sensor 300 positioned over the rear surface of the display panel 100 does not measure the external light through the area in which the plurality of second pixels SP are provided.

When the optical sensor 300 is a camera, the image photographed by the optical sensor 300 includes a degradation area in which a luminance value is lower than a reference luminance value by the plurality of second pixels SP, whereby resolution can be remarkably reduced. For example, the plurality of second pixels SP and the plurality of transmissive areas TA may be disposed in the area SA overlapping with the optical sensor 300 in one-to-one basis. In this case, since only 50% of the area SA overlapped with the optical sensor 300 becomes the transmissive area TA, resolution of the image photographed by the optical sensor 300 may be remarkably reduced. When a ratio of the area in which the plurality of second pixels SP are disposed in the area SA overlapped with the optical sensor 300 is increased, resolution of the image photographed by the optical sensor 300 may be smaller than 50%. Therefore, image quality of the optical sensor 300 may be remarkably reduced.

In the display device 10 according to one embodiment of the present disclosure, the display panel 100 may move based on the operation of the optical sensor 300, whereby the position of the area SA overlapped with the optical sensor 300 may be changed. Therefore, the position of the plurality of transmissive areas TA disposed over the optical sensor 300 may be changed.

Hereinafter, an operation relation of the optical sensor 300, the display panel 100 and the roller portion 200 will be described in detail with reference to FIGS. 6 to 12.

Figure 6:
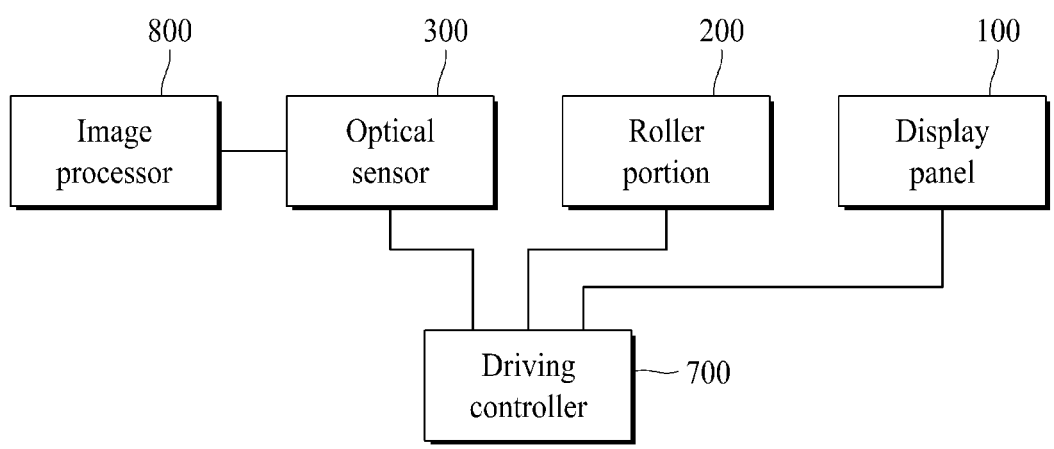
FIG. 6 is a schematic block view illustrating elements of a display device according to one embodiment of the present disclosure.
Figure 7:
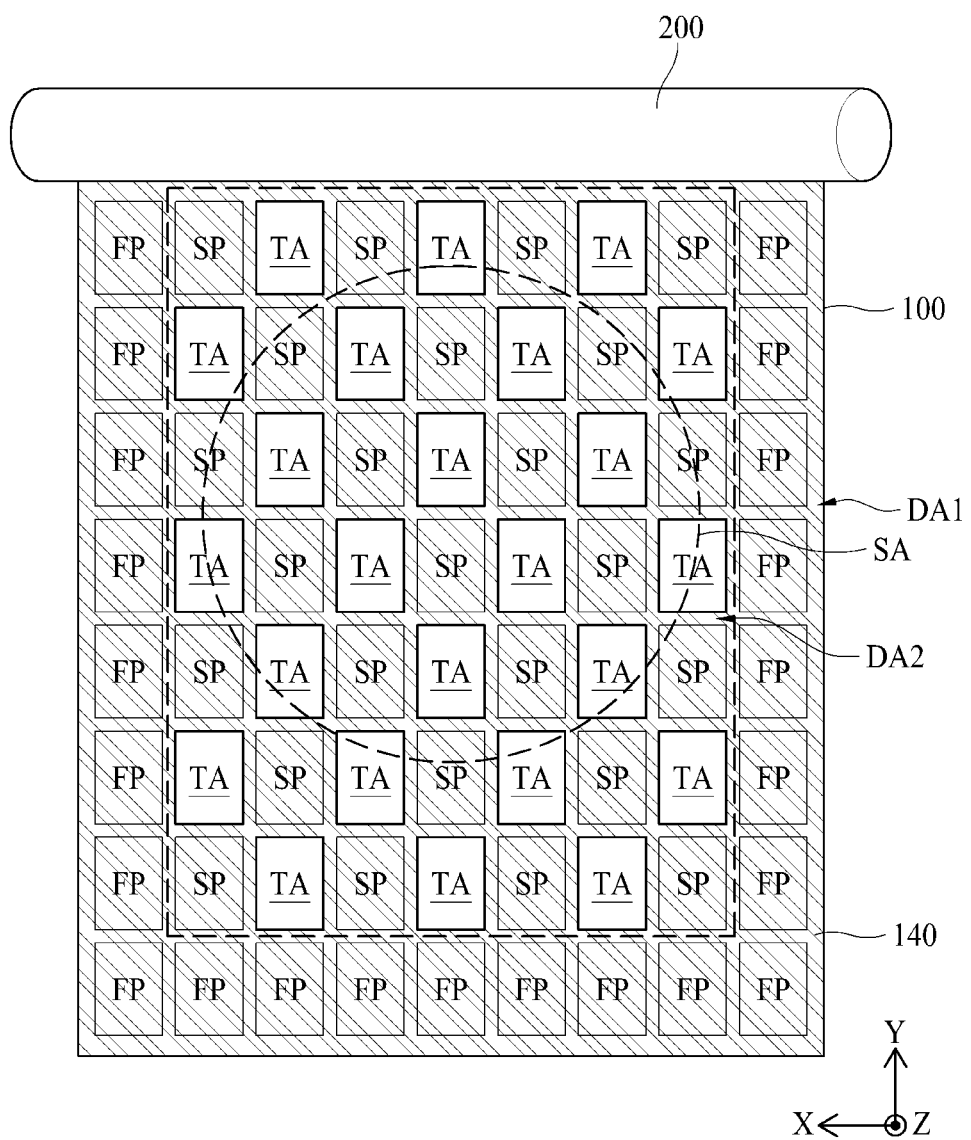
FIG. 7 is a schematic view illustrating an example of a plurality of transmissive areas disposed in an area overlapped with an optical sensor at a photographing timing of a first frame image.
Figure 8:
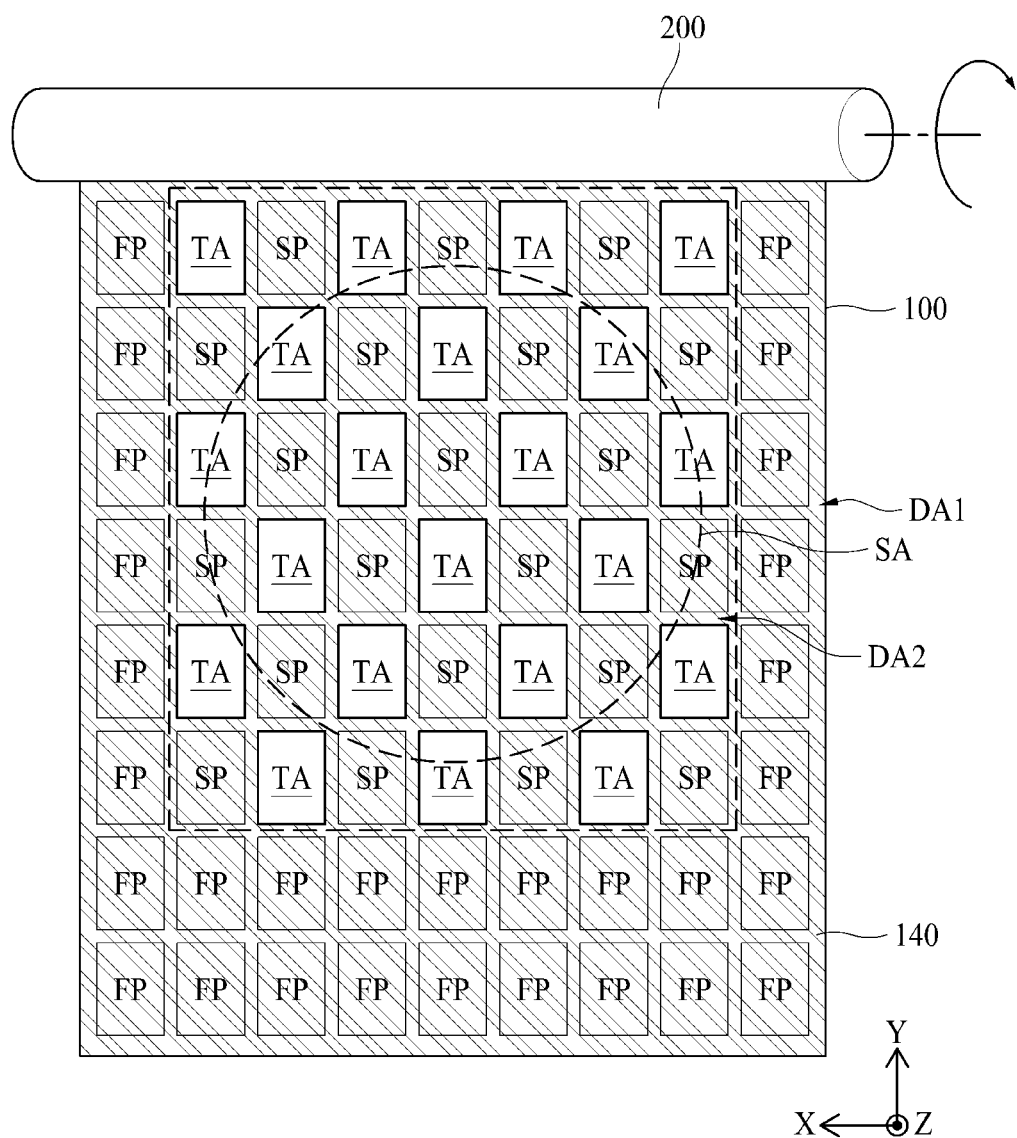
FIG. 8 is a schematic view illustrating an example of a plurality of transmissive areas disposed in an area overlapped with an optical sensor at a photographing timing of a second frame image.
Figure 9:
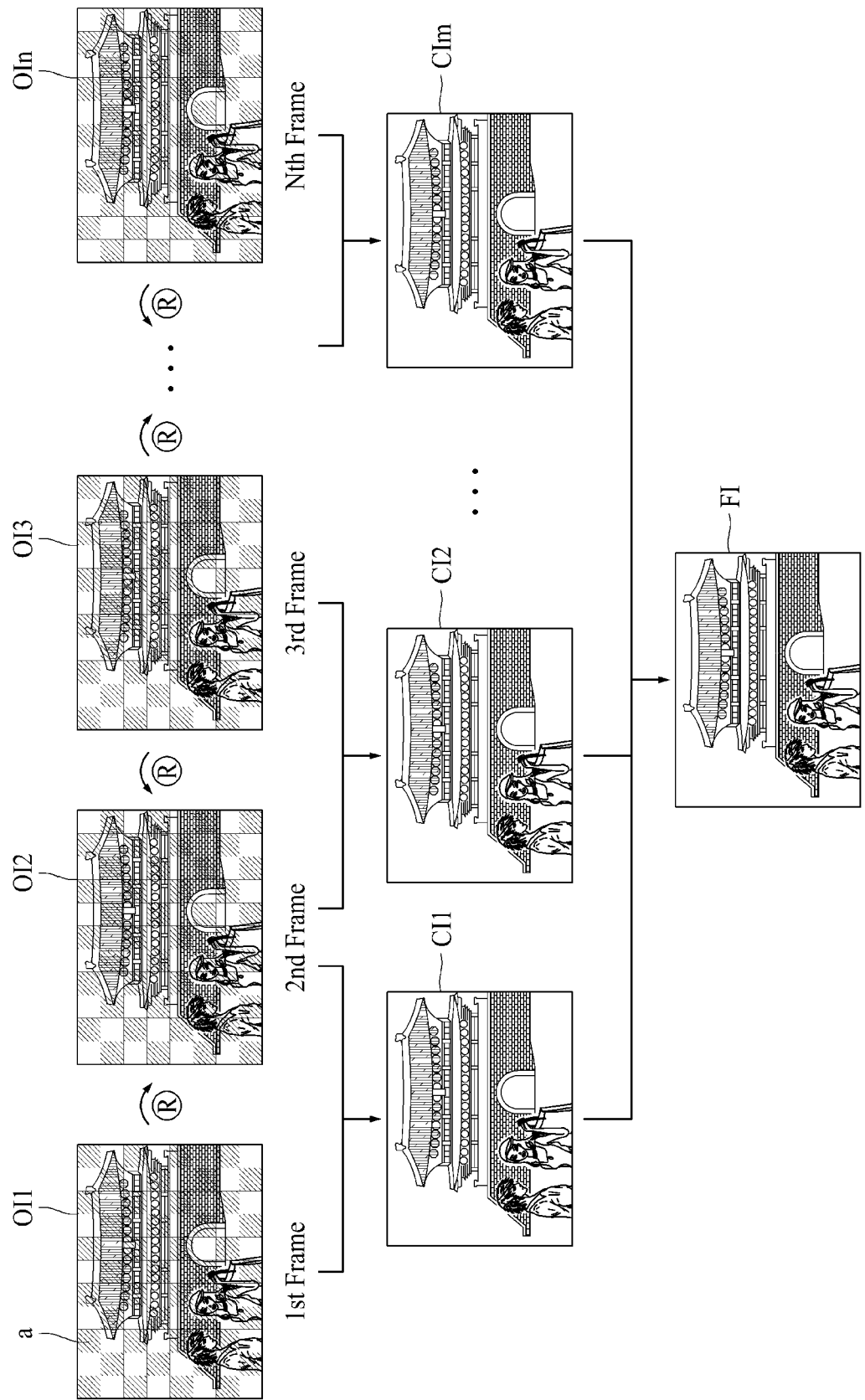
FIG. 9 is a view illustrating an example in which a plurality of frame images are synthesized when a photographing period of an optical sensor and a rotational period of a roller are the same as each other.
Figure 10:
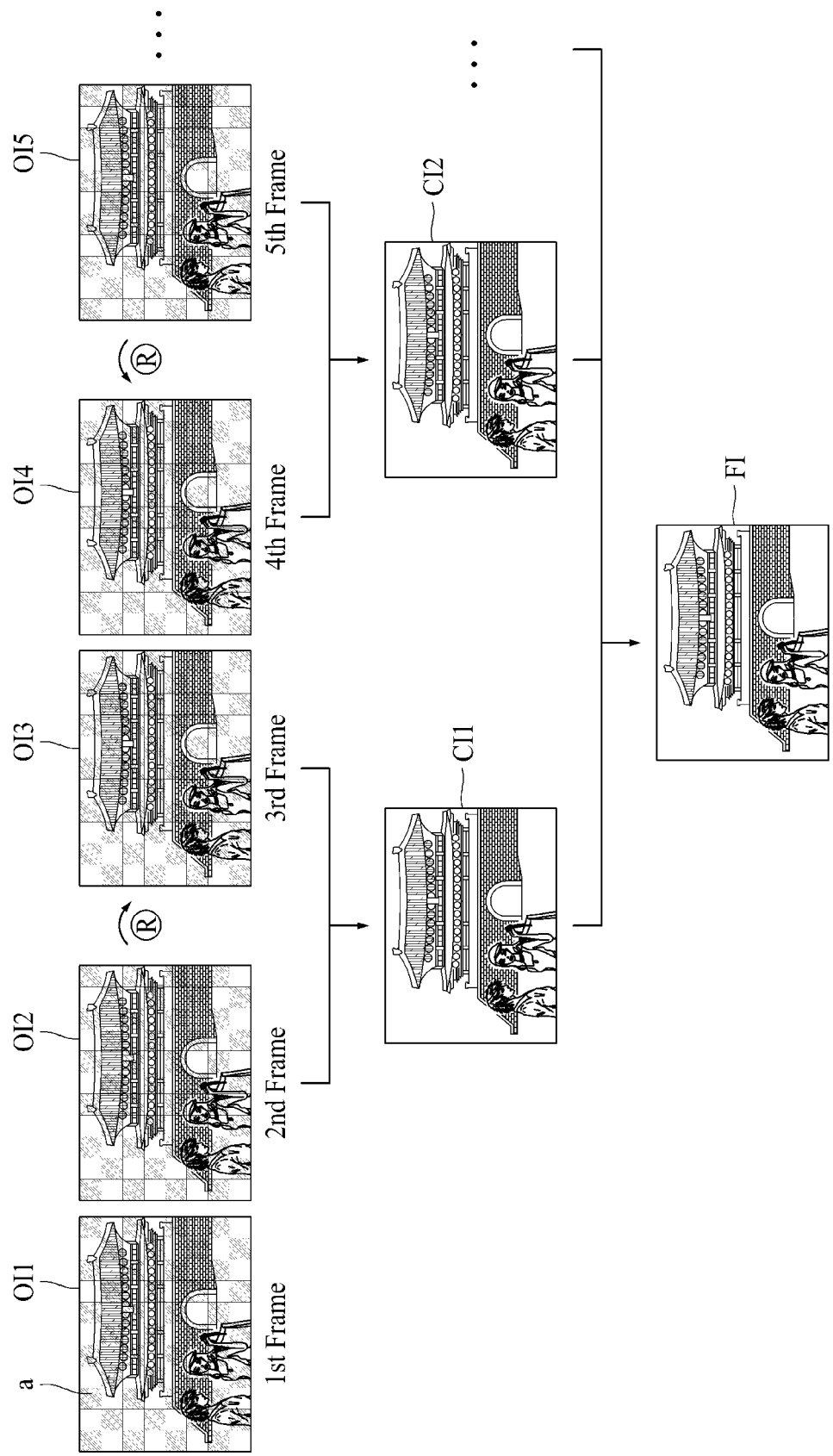
FIG. 10 is a view illustrating an example in which a plurality of frame images are synthesized when a photographing period of an optical sensor and a rotational period of a roller are different from each other.
Figure 11:
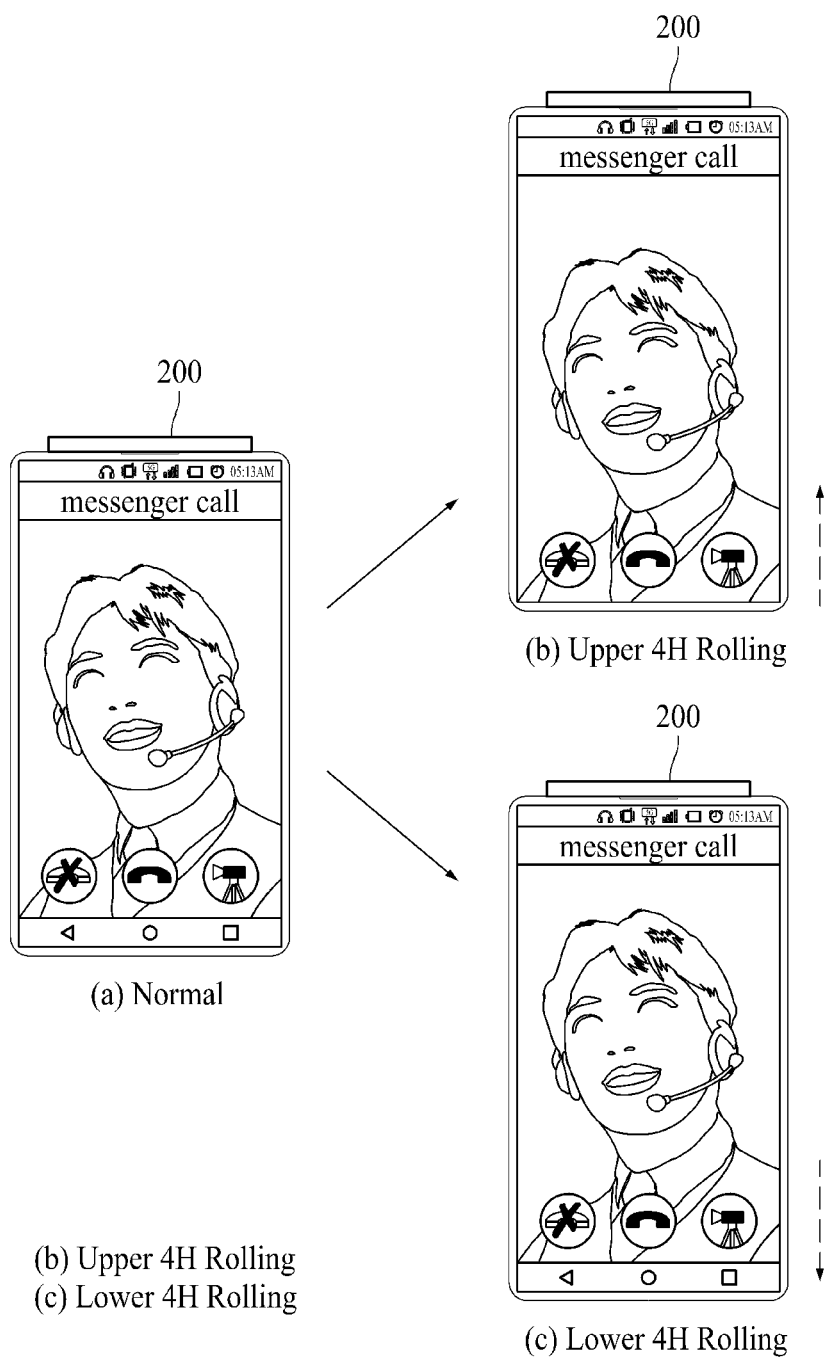
FIG. 11 is a view illustrating an example of an image displayed on a display panel when the display panel moves upward or downward.
Figure 12:
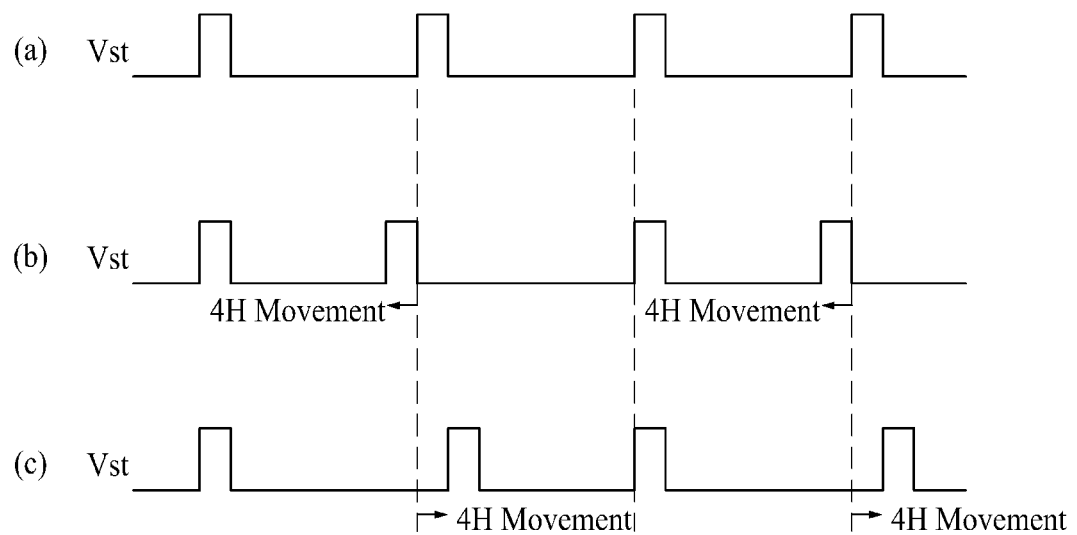
FIG. 12 is a timing view illustrating a timing of a gate start signal when a display panel moves upward or downward.

FIG. 6 is a schematic block view illustrating elements of a display device according to one embodiment of the present disclosure, FIG. 7 is a schematic view illustrating an example of a plurality of transmissive areas disposed in an area overlapped with an optical sensor at a photographing timing of a first frame image, and FIG. 8 is a schematic view illustrating an example of a plurality of transmissive areas disposed in an area overlapped with an optical sensor at a photographing timing of a second frame image. FIG. 9 is a view illustrating an example in which a plurality of frame images are synthesized when a photographing period of an optical sensor and a rotational period of a roller are the same as each other, and FIG. 10 is a view illustrating an example in which a plurality of frame images are synthesized when a photographing period of an optical sensor and a rotational period of a roller are different from each other. FIG. 11 is a view illustrating an example of an image displayed on a display panel when the display panel moves upward or downward, and FIG. 12 is a timing view illustrating a timing of a gate start signal when a display panel moves upward or downward.

Referring to FIGS. 6 to 12, the display device 10 according to one embodiment of the present disclosure includes a display panel 100, a roller portion 200, an optical sensor 300, a driving controller 700 and an image processor 800.

Since the display panel 100, the roller portion 200 and the optical sensor 300 are substantially the same as the display panel 100, the roller portion 200 and the optical sensor 300 described above, their detailed description will be omitted.

The driving controller 700 may control the operation of the display panel 100, the roller portion 200 and the optical sensor 300. More specifically, the driving controller 700 may control the roller of the roller portion 200 to rotate forward or backward based on the operation of the optical sensor 300. The driving controller 700 may control the roller of the roller portion 200 to rotate forward or backward based on the photographing timing of the optical sensor 300.

The optical sensor 300 may acquire a plurality of frame images by continuously photographing images in accordance with an operation signal. The plurality of frame images obtained by the optical sensor 300 may be synthesized by the image processor 800 to generate one image.

The driving controller 700 may move the display panel 100 by rotating the roller of the roller portion 200 between photographing timings of the plurality of frame images. For example, the optical sensor 300 may acquire a first frame image and a second frame image, which are continuous. The roller of the roller portion 200 may rotate forward or backward between the photographing timing of the first frame image and the photographing timing of the second frame image under the control of the driving controller 700.

The display panel 100 may move upward while winding when the roller is rotated forward. In addition, the display panel 100 may move downward while unwinding when the roller is rotated backward. At this time, the display panel 100 may move as much as a plurality of pixel pitches. For example, the display panel 100 may move as much as four pixel pitches. As the display panel 100 moves upward or downward as much as a plurality of pixel pitches, the position of the display panel 100 that overlaps the optical sensor 300 may be changed.

In detail, the optical sensor 300 may acquire the first frame image over the rear surface of the display panel 100 shown in FIG. 7. When the optical sensor 300 acquires the first frame image, the driving controller 700 may control the roller of the roller portion 200 to rotate forward. Therefore, as shown in FIG. 8, the display panel 100 may move upward as much as a pixel pitch over the optical sensor. As the display panel 100 moves upward, the position of the plurality of transmissive areas TA may vary within the area SA overlapped with the optical sensor 300. When the display panel 100 moves, the optical sensor 300 may acquire the second frame image under the control of the driving controller 700.

The display panel 100 moves in accordance with rotation of the roller between the photographing timing of the first frame image and the photographing timing of the second frame image, so that the position of the plurality of transmissive areas TA may be different within the area SA overlapped with the optical sensor 300. Therefore, in the optical sensor 300, the area on which external light is incident at the photographing timing of the first frame image and the area on which external light is incident at the photographing timing of the second frame image may be different from each other.

For example, external light may be incident on an area, on which the external light is not incident by the second pixels SP at the photographing timing of the first frame image, by transmitting through the transmissive area TA at the photographing timing of the second frame image. Therefore, the first frame image and the second frame image may be different from each other in the position of the degradation area where the luminance value is lower than the reference luminance value.

Meanwhile, the driving controller 700 may control the roller of the roller portion 200 to repeat forward rotation and backward rotation. More specifically, the optical sensor 300 may continuously acquire first to fourth frame images. The driving controller 700 may control the roller of the roller portion 200 to rotate forward between the photographing timing of the first frame image and the photographing timing of the second frame image. Therefore, the display panel 100 may move upward while winding. In addition, the driving controller 700 may control the roller of the roller portion 200 to rotate backward between the photographing timing of the second frame image and a photographing timing of a third frame image. Therefore, the display panel 100 may move downward to return to its original state while unwinding. In addition, the driving controller 700 may control the roller of the roller portion 200 to rotate forward between the photographing timing of the third frame image and a photographing timing of the fourth frame. Therefore, the display panel 100 may move upward while winding.

The driving controller 700 may determine a rotational period of the roller of the roller portion 200 based on the photographing period of the optical sensor. In one embodiment, the driving controller 700 may control the roller of the roller portion 200 to rotate with the same period as the photographing period of the optical sensor 300. In detail, as shown in FIG. 9, the driving controller 700 may control the roller R of the roller portion 200 to rotate whenever one frame image is acquired. For example, the optical sensor 300 may acquire 60 frame images per one second. The driving controller 700 may control the roller R of the roller portion 200 to rotate 60 times per one second.

In another embodiment, the driving controller 700 may control the roller of the roller portion 200 to rotate with a period longer than the photographing period of the optical sensor 300. In detail, as shown in FIG. 10, the driving controller 700 may control the roller R of the roller portion 200 to rotate whenever a plurality of frame images are acquired. For example, the optical sensor 300 may acquire 60 frame images per one second. The driving controller 700 may control the roller R of the roller portion 200 to rotate whenever two frame images are acquired. That is, the driving controller 700 may control the roller R of the roller portion 200 to rotate 30 times per one second.

The image processor 800 may synthesize the plurality of frame images acquired by the optical sensor 300 to generate one image. The image processor 800 may synthesize a plurality of frame images differently depending on the rotational period of the roller of the roller portion 200.

When the rotational period of the roller R of the roller portion 200 is the same as the photographing period of the optical sensor 300, the image processor 800 may synthesize an odd-numbered frame image and an even-numbered frame image, which are continuous. Referring to FIG. 9, the image processor 800 may synthesize a first frame image OI1 and a second frame image OI2 to generate a first composite image CI1. At this time, the generated first composite image CI1 is generated by synthesizing two frame images OI1 and OI2 that are different from each other in the positions of the degradation area 'a', and may correspond to an image with transmittance more improved than that of the two frame images OI1 and OI2.

In addition, the image processor 800 may synthesize the second frame image OI2 and a third frame image OI3 to generate a second composite image CI2. At this time, the generated second composite image CI2 is generated by synthesizing two frame images OI3 and O14 that are different from each other in the positions of the degradation area 'a', and may correspond to an image with transmittance more improved than that of the two frame images OI3 and O14. The image processor 800 may generate M number of composite images CI1, CI2, . . . , CIm with improved transmittance based on N number of frame images OI1, OI2, . . . , OIn. In this case, M may correspond to N−1. The image processor 800 may again synthesize the plurality of composite images CI1, CI2, . . . , CIm to generate one final image FI.

Meanwhile, when the rotational period of the roller R of the roller portion 200 is longer than the photographing period of the optical sensor 300, two frame images continuous with rotation of the roller R of the roller 200 therebetween may be synthesized. Referring to FIG. 10, the roller R of the roller portion 200 may rotate whenever two frame images are acquired. In this case, the image processor 800 may synthesize the second frame image OI2 and the third frame image OI3 continuous with rotation of the roller R therebetween to generate a first composite image CI1. At this time, the generated first composite image CI1 is generated by synthesizing two frame images OI2 and OI3 that are different from each other in the positions of the degradation area 'a', and may correspond to an image with transmittance more improved than that of the two frame images OI2 and OI3.

In addition, the image processor 800 may synthesize the fourth frame image O14 and a fifth frame image O15, which are continuous with rotation of the roller R therebetween, to generate a second composite image CI2. At this time, the generated second composite image CI2 is generated by synthesizing two frame images O14 and O15 that are different from each other in the positions of the degradation area 'a', and may correspond to an image with transmittance more improved than that of the two frame images O14 and O15. The image processor 800 may generate M number of composite images CI1, CI2, . . . , CIm with improved transmittance based on N number of frame images OI1, OI2, . . . , OIn. In this case, M may correspond to (N−1)/2. The image processor 800 may again synthesize the plurality of composite images CI1, CI2, . . . , CIm to generate one final image FI.

Meanwhile, the driving controller 700 may control the image displayed on the display panel 100 to be shifted based on the operation of the roller portion 200. The driving controller 700 may control the roller of the roller portion 200 to rotate forward or backward, thereby moving the display panel 100 upward or downward. The driving controller 700 may control the display panel 100 to shift the image displayed on the display panel 100 as much as movement of the display panel 100 such that a user does not recognize the movement of the display panel 100.

The driving controller 700 may shift the image displayed on the display panel 100 by controlling a timing of a gate start signal Vst among gate control signals for controlling the gate driver. For example, the gate start signal Vst may be generally input to the gate driver at a predetermined period as shown in FIG. 12, part (a). The gate driver may generate gate signals in accordance with the gate start signal Vst and output the gate signals to the gate lines.

As shown in FIG. 11, part (b), the roller of the roller portion 200 rotates forward, so that the display panel 100 may move upward as much as a plurality of pixel pitches, for example, four pixel pitches. In this case, the gate start signal Vst may move to a left side as much as a timing of a fourth horizontal line 4H as shown in FIG. 12, part (b). Further, when the display panel 100 moves downward by backward rotation of the roller of the roller portion 200 and then returns to its original state, the gate start signal Vst may move to a right side as much as a timing of the fourth horizontal line 4H.

As shown in FIG. 11, part (c), the roller of the roller portion 200 rotates backward, so that the display panel 100 may move downward as much as a plurality of pixel pitches, for example, four pixel pitches. In this case, the gate start signal Vst may move to the right side as much as a timing of a fourth horizontal line 4H as shown in FIG. 12, part (c). Further, when the display panel 100 moves upward by forward rotation of the roller of the roller portion 200 and then returns to its original state, the gate start signal Vst may move to the left side as much as a timing of the fourth horizontal line 4H.

As described above, as shown in FIG. 11, the display panel 100 may shift up or down the displayed image even though the display panel 100 moves upward as much as a plurality of pixel pitches by forward rotation of the roller of the roller portion 200 or moves downward as much as a plurality of pixel pitches by backward rotation of the roller of the roller portion 200. Therefore, since the image displayed on the display panel 100 may not move up or down, the movement of the display panel 100 may not be recognized by the user.

The display device 10 according to one embodiment of the present disclosure is characterized in that the optical sensor 300 acquires a plurality of frame images while the display panel 100 disposed thereon is moving. In the display device 10 according to one embodiment of the present disclosure, as the display panel 100 moves, the position of the plurality of transmissive areas TA disposed on the optical sensor 300 may vary. Therefore, the frame image acquired prior to the movement of the display panel 100 and the frame image acquired after the movement of the display panel 100 may be different from each other in the position of the degradation area. The display device 10 according to one embodiment of the present disclosure may improve resolution and quality of an image by synthesizing frame images that are different from each other in the position of the degradation area.

In addition, the display device 10 according to one embodiment of the present disclosure is characterized in that the display panel 100 moves instead of the optical sensor 300. As one of methods of improving resolution of an image, it may be considered to acquire a plurality of frame images while the optical sensor 300 is moving, unlike the present disclosure. However, the plurality of frame images acquired while the optical sensor 300 is moving may be different from each other in the acquired area depending on the position of the optical sensor 300. That is, optical axes of the plurality of frame images may be different from each other.

As described above, in order to synthesize a plurality of frame images having different optical axes, there is a need for a complex pre-processing process, such as stereo image composition, for matching optical axes of the plurality of frame images and extracting overlap areas. In addition, since image composition is performed in such a manner that only overlap areas are extracted from the plurality of frame images, resolution is deteriorated.

On the other hand, when a plurality of frame images are acquired while the display panel 100 is moving like the present disclosure, since the optical sensor 300 does not move, the optical axes of the acquired plurality of frame images may be the same. Therefore, the display device 10 according to one embodiment of the present disclosure does not require a complex pre-processing process such as matching the optical axes of the plurality of frame images, and may simply extract reliable pixel data from each of the frame images to generate a composite image based on the extracted pixel data. That is, in the display device 10 according to one embodiment of the present disclosure, since the image composite process is simple, fast image processing may be performed. Furthermore, since all areas of the plurality of frame images are the same, deterioration of resolution may not occur during image composition.

According to the present disclosure, the following advantageous effects may be obtained.

In the present disclosure, the optical sensor may acquire the plurality of frame images and synthesize the acquired frame images while the display panel disposed thereon is moving, whereby resolution and quality of the image may be improved.

Also, in the present disclosure, the images may be synthesized without deterioration of resolution, and the image composite process is simple, whereby fast image processing may be performed.

In addition, in the present disclosure, the display image is shifted together when the display panel moves, so that the movement of the display panel may not be easily recognized to the user.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
a display panel including a first display area and a second display area in which a plurality of transmissive areas are disposed;
a roller portion coupled to the display panel at one side of the display panel, including a roller that makes the display panel move when rotating;
an optical sensor disposed to overlap the second display area of the display panel; and
a driving controller controlling the roller to rotate forward or backward to move the display panel based on an operation of the optical sensor,
wherein when the display panel moves, the optical sensor acquires a plurality of images for synthetization.

2. The display device of claim 1, wherein the plurality of images include a first frame image and a second frame image, which are continuous, and
the roller of the roller portion rotates forward or backward between a photographing timing of the first frame image and a photographing timing of the second frame image under the control of the driving controller.

3. The display device of claim 1, wherein the roller of the roller portion rotates forward or backward under the control of the driving controller to move the display panel as much as a plurality of pixel pitches.

4. The display device of claim 1, wherein the driving controller controls the optical sensor to acquire frame images at a first period and controls the roller portion to move the display panel at a second period.

5. The display device of claim 4, wherein the second period is the same as the first period.

6. The display device of claim 4, wherein the second period is longer than the first period.

7. The display device of claim 1, wherein the driving controller controls an image displayed on the display panel to be shifted based on an operation of the roller portion.

8. The display device of claim 7, wherein the image displayed on the display panel is shifted as much as pixel pitches moved by the roller portion under the control of the driving controller.

9. The display device of claim 1, wherein the driving controller controls the roller to repeat forward rotation and backward rotation.

10. The display device of claim 1, wherein the second display area includes a plurality of pixel areas and the plurality of transmissive areas provided between the plurality of pixel areas.

11. The display device of claim 1, further comprising an image processor synthesizing a plurality of frame images acquired by the optical sensor.

12. A display device comprising:
an optical sensor acquiring a first frame image and a second frame image continuously for synthetization in accordance with an operation signal; and
a display panel including a first display area and a second display area overlapped with the optical sensor in which a plurality of transmissive areas are disposed,
wherein the display panel has different positions overlapped with the optical sensor at a photographing timing of the first frame image and a photographing timing of the second frame image, and
wherein the display panel moves over the optical sensor between the photographing timing of the first frame image and the photographing timing of the second frame image.

13. The display device of claim 12, wherein the plurality of transmissive areas of the display panel are different in positions at the photographing timing of the first frame image and the photographing timing of the second frame image.

14. The display device of claim 12, wherein an image displayed on the display panel is shifted as much as movement of the display panel.

15. The display device of claim 12, further comprising an image processor generating a composite image by synthesizing the first frame image and the second frame image.

* * * * *